United States Patent
Smith et al.

(10) Patent No.: US 9,732,934 B2
(45) Date of Patent: Aug. 15, 2017

(54) ILLUMINATION DEVICE FOR OPTIMIZING POLARIZATION IN AN ILLUMINATION PUPIL

(71) Applicant: Nikon Corporation, Tokyo (JP)

(72) Inventors: Daniel Gene Smith, Tucson, AZ (US); Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 512 days.

(21) Appl. No.: 13/662,140

(22) Filed: Oct. 26, 2012

(65) Prior Publication Data

US 2013/0148359 A1    Jun. 13, 2013

Related U.S. Application Data

(60) Provisional application No. 61/628,314, filed on Oct. 28, 2011.

(51) Int. Cl.
| | |
|---|---|
| *F21V 7/22* | (2006.01) |
| *F21V 7/00* | (2006.01) |
| *G03F 7/20* | (2006.01) |
| *F21V 7/04* | (2006.01) |

(52) U.S. Cl.
CPC ........ *F21V 7/0033* (2013.01); *G03F 7/70116* (2013.01); *G03F 7/70566* (2013.01)

(58) Field of Classification Search
CPC ...... G02B 5/08–5/10; G02B 5/30–5/32; F21V 7/003; G03F 7/70566; G03F 7/70116
USPC .......................... 362/277–284, 296.01–296.1
See application file for complete search history.

(56) References Cited

U.S. PATENT DOCUMENTS

| | | | |
|---|---|---|---|
| 6,900,915 B2* | 5/2005 | Nanjyo | G02B 26/0841 359/224.1 |
| 6,913,373 B2 | 7/2005 | Tanaka et al. | |
| 2004/0184019 A1* | 9/2004 | Totzeck | G02B 5/1809 355/71 |
| 2007/0146676 A1 | 6/2007 | Tanitsu et al. | |
| 2007/0188730 A1 | 8/2007 | Takeuchi et al. | |
| 2007/0296936 A1 | 12/2007 | Kato et al. | |
| 2008/0030707 A1 | 2/2008 | Tanaka et al. | |
| 2009/0109417 A1 | 4/2009 | Tanitsu | |
| 2009/0117494 A1 | 5/2009 | Owa | |
| 2009/0128886 A1 | 5/2009 | Hirota | |
| 2009/0135392 A1* | 5/2009 | Muramatsu | G03F 7/70116 355/67 |

(Continued)

FOREIGN PATENT DOCUMENTS

| | | |
|---|---|---|
| EP | 0779530 | 6/1997 |
| WO | 2010040506 | 4/2010 |

(Continued)

*Primary Examiner* — Elmito Breval
*Assistant Examiner* — Nathaniel Lee
(74) *Attorney, Agent, or Firm* — Yakov S. Sidorin; Quarles & Brady LLP

(57) ABSTRACT

A new and useful illumination device, e.g. for a lithographic optical imaging system, is provided, and comprises a mirror array located between a radiation source and an illumination pupil. Each mirror element of the mirror array is individually steerable (controllable), and the polarization state of light from each mirror element of the mirror array can be selectively controlled, so that the illumination pupil can be filled with a distribution of light that is selectively controlled.

31 Claims, 5 Drawing Sheets

(56) References Cited

U.S. PATENT DOCUMENTS

| | | | |
|---|---|---|---|
| 2010/0165318 A1 | 7/2010 | Fiolka et al. | |
| 2012/0212722 A1* | 8/2012 | Smith | G03F 7/7055 355/67 |
| 2013/0050673 A1* | 2/2013 | Saenger | G03F 7/70566 355/67 |
| 2013/0077077 A1* | 3/2013 | Saenger | G03F 7/70566 355/71 |

FOREIGN PATENT DOCUMENTS

| | | |
|---|---|---|
| WO | 2010037476 | 8/2010 |
| WO | 2011147658 | 12/2011 |

\* cited by examiner

ILLUMINATION DEVICE FOR OPTIMIZING POLARIZATION IN AN ILLUMINATION PUPIL

RELATED APPLICATION/CLAIM OF PRIORITY

The present application is related to and claims priority from provisional application Ser. No. 61/628,314, filed Oct. 28, 2011, and entitled Illumination Device for optimizing polarization in an illumination pipit, which provisional application is incorporated by reference herein.

INTRODUCTION AND SUMMARY OF THE PRESENT INVENTION

The present teaching provides an illumination device for source mask optimization of the polarization distribution in the illumination pupil of a lithographic optical imaging system.

The illumination device comprises a mirror array located between a radiation source and an illumination pupil, and each mirror element of the mirror array is individually steerable (controllable), and the polarization state of light from each mirror element, or groups of elements, of the mirror array can be selectively controlled, so that the illumination pupil can be filled with a distribution of light that is selectively controlled.

The present teaching provides an illumination device, e.g. for a lithographic optical imaging system, comprising a mirror array located between a radiation source and an illumination pupil, where each mirror element of the mirror array is individually steerable (controllable), and the polarization state of light from each mirror element of the mirror array can be selectively controlled, so that the illumination pupil can be filled with a distribution of light that is selectively controlled.

There are several ways in which the present teaching can be implemented. For example,
  a. A retarder coating can be applied to selected mirror elements to control the polarization state of light reflected from each mirror element of the mirror array. In addition, a wave plate can be provided before the mirror array to set the incident polarization, and thereby making the polarization switchable.
  b. An additional mirror array can be provided between the mirror array and the illumination pupil, where the additional mirror array receives radiation from the mirror array and directs the radiation to the illumination pupil. Preferably, the additional mirror array is conjugate to the mirror array. Also the system can use any of the following concepts:
    i. an intervening relay system located between the mirror arrays.
    ii. an array of polarization filters (or retarders) can be located between the mirror arrays.
    iii. a wedge of optically active material can be located between the mirror arrays, such that the orientation of linear polarization leaving the wedge depends continuously on the position of the beam in the wedge.

These and other features of the present teaching will be further apparent from the following detailed description and the accompanying drawings.

DETAILED DESCRIPTION

As described above, the present embodiment provides an illumination device for source mask optimization of the polarization distribution in the illumination pupil of a lithographic optical imaging system, e.g. for a lithograph optical imaging system that uses ArF (Argon Fluoride), or KrF (Krypton Fluoride) radiation source.

The illumination device comprises a mirror array (e.g. a Micro-Mirror Array or MMA) located between a radiation source and an illumination pupil, and each mirror element of the mirror array is individually steerable (controllable), and the polarization state of light from each mirror element, or groups of elements, of the mirror array can be selectively controlled, so that the illumination pupil can be filled with a distribution of light that is selectively controlled.

The following description shows various ways in which the present invention can be implemented, and from that description it is believed that various other ways in which the present invention can be implemented will be apparent to those in the art.

Figure 1:
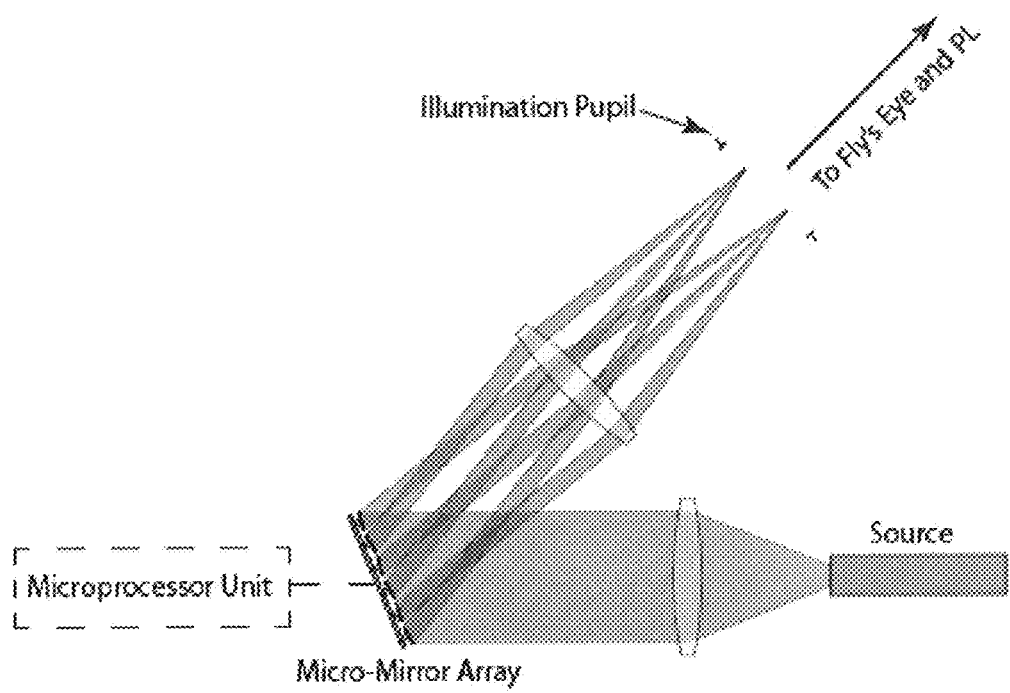
FIG. 1 is a schematic illustration of an illumination system without polarization control with a mirror array located between the source and the illumination pupil.

Initially, it is believed useful to understand the concept of how an illumination system without polarization control can be implemented with a mirror array (e.g. a Micro-Mirror Array, or MMA) located between the source and the illumination pupil. FIG. 1 schematically shows such a system. The mirror array of FIG. 1 (referred to in the figures as a Micro-Mirror Array) is a known system that is used to distribute light of a single polarization in the illumination pupil. A well known method for generated pupil position dependent polarizations, is to place polarization filter masks roughly conjugate to the pupil. With the system of FIG. 1, each mirror element of the mirror array is individually steerable (adjustable), e.g. by a microprocessor unit, so that the illumination pupil can be filled with a controlled distribution of light (radiation). The more mirror elements in the mirror array, the more detailed control over the illumination distribution that can be exercised. In another known approach, polarization filter masks can be placed near the mirror array so that the incident radiation will have different polarizations for adjacent groups of elements, and then those elements can be steered to send their polarization to predetermined regions in the pupil.

In the present embodiment, the mirror array to be used can be, for example, those continuously changing each of orientations of the mirror elements arranged two-dimensionally. Such mirror array can be selected, for example, from the mirror arrays disclosed in U.S. Pat. Nos. 6,900,915, 7,095,546, and 7,884,920. It is also possible to control the orientations of the mirror elements arranged two-dimensionally, in a plurality of discrete steps. The teachings in U.S. Pat. Nos. 6,900,915, 7,095,546, and 7,884,920 are incorporated herein by reference.

Figure 2:
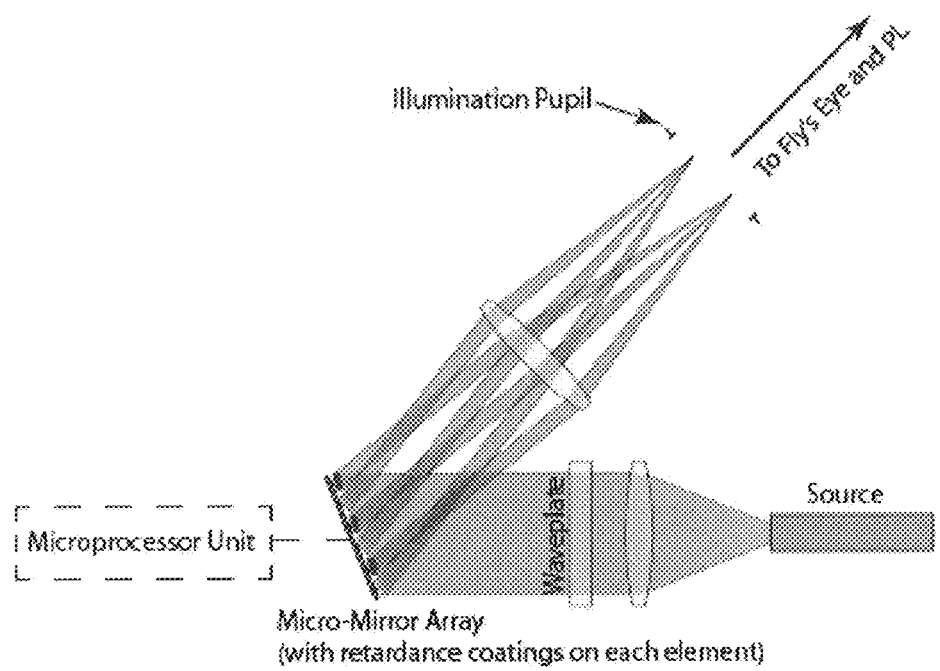
FIG. 2 is a schematic illustration of one embodiment of the present invention, in which polarization control is obtained through the retardance of thin films deposited on the individual mirror elements.

In one embodiment of this invention, polarization control is obtained through the retardance of thin films deposited on the individual mirror elements as shown in FIG. 2. The retardance of a coating generally depends on the design of the coating, which includes the choice of material refractive indices, the number and thickness of the layers. The retardance also depends on the angle of incidence and wavelength of light, but coatings can be designed that are insensitive to angle of incidence over some range of angles and wavelengths of light. The polarization of the light that reaches the illumination pupil from each mirror element then depends on the retardance of each mirror element's coating, and on the polarization of the incident light, which can be controlled by the orientation of a waveplate, for example, placed just before the mirror array as shown in FIG. 2. Other means of adjusting the incident polarization, in an embodiment such as FIG. 2, will be apparent to the those skilled in the art. For example, a polarization rotation element such as waveplate disclosed in U.S. Pat. No. 7,423,731 can be used to adjust the incident polarization. The teaching of U.S. Pat. No. 7,423,731 are incorporated herein by reference.

In this embodiment, the fourier transforming optical system between the mirror array and the illumination pupil has a front focal point positioned near the mirror array and a rear focal point positioned near the illumination pupil.

In the illustrative example of FIG. 2, when the incident polarization is in the plane of incidence (or perpendicular to it), no change in polarization will occur. However, when the polarization is rotated to 45 degrees, the reflected polarization is further modified by the mirror retardance coatings. If the retardance coating on a given mirror element has half of wave of retardance and the incident polarization is 45 degrees to the plane of incidence, then the reflected polarization will be rotated 90 degrees upon reflection. If half of the mirror elements have the half-wave of retardance, the other half have no retardance, the system can produce two polarization states in equal amounts that can be distributed anywhere in the illumination pupil. The number of available polarizations then depends on the number of unique coatings on the individual mirror elements.

In this embodiment, a lamda/4 plate may be disposed downstream of the fourier transforming optical system.

Figure 3:
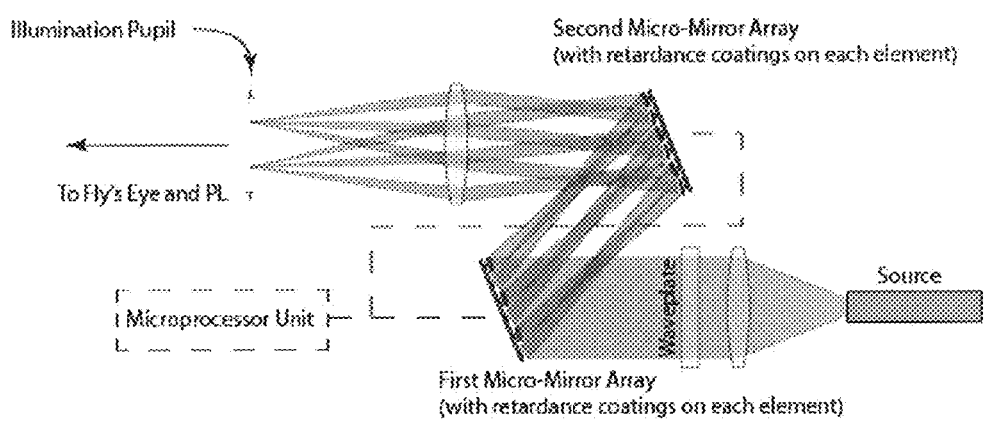
FIG. 3 is a schematic illustration of an embodiment in which polarization control in the illumination system can be implemented with a pair of mirror arrays, according to the present invention.

In addition, it is contemplated that polarization control in the illumination system can be implemented with a pair of mirror arrays, in the manner schematically shown in FIG. 3, where the illumination system is designed to allow for the first mirror array to send light to elements in the second mirror array. Where both mirror arrays have thin film coatings with predetermined retardances on each mirror element. In this embodiment, the mirror elements of the first mirror array are steered to direct light to mirror elements in the second mirror array and the mirror elements of the second mirror array direct light to specific locations within the illumination pupil. Furthermore, in this embodiment, the polarization state arriving at the illumination pupil depends on the polarization arriving at the first mirror array (which is optionally controlled through the orientation of a waveplate) the retardance of the coatings on the mirror elements of the first mirror array and the retardance of the coatings on the mirror elements of the second mirror array. One aspect of this embodiment is that the presence of a second set of retarding coatings on the mirror elements of the second mirror array provides additional freedom to select either a wider range of polarizations, or finer control of the polarization. The finer control of polarization arises from the fact that the retardance of the mirror coatings depends on the angle of incidence, and with a second set of mirrors, there is the option of selecting combinations of mirrors in the first and second mirror arrays that provides compensating angles of incidence to reach the desired overall retardance. Also, the waveplate could be made to be segmented with several different retardances in different regions of the beam for even greater flexibility, and different segmented or non-segmented waveplates be changed, in situ, via a turret for example. These segmented waveplates disclosed in U.S. Pat. Application Laid-Open No. 2011/0228247. The teaching of the U.S. Pat. Application Laid-Open No. 2011/0228247 are incorporated herein by reference.

In this embodiment, the fourier transforming optical system between the second mirror array and the illumination pupil has a front focal point positioned near the second mirror array and a rear focal point positioned near the illumination pupil. In this embodiment, a lamda/4 plate may be disposed downstream of the fourier transforming optical system.

Figure 4:
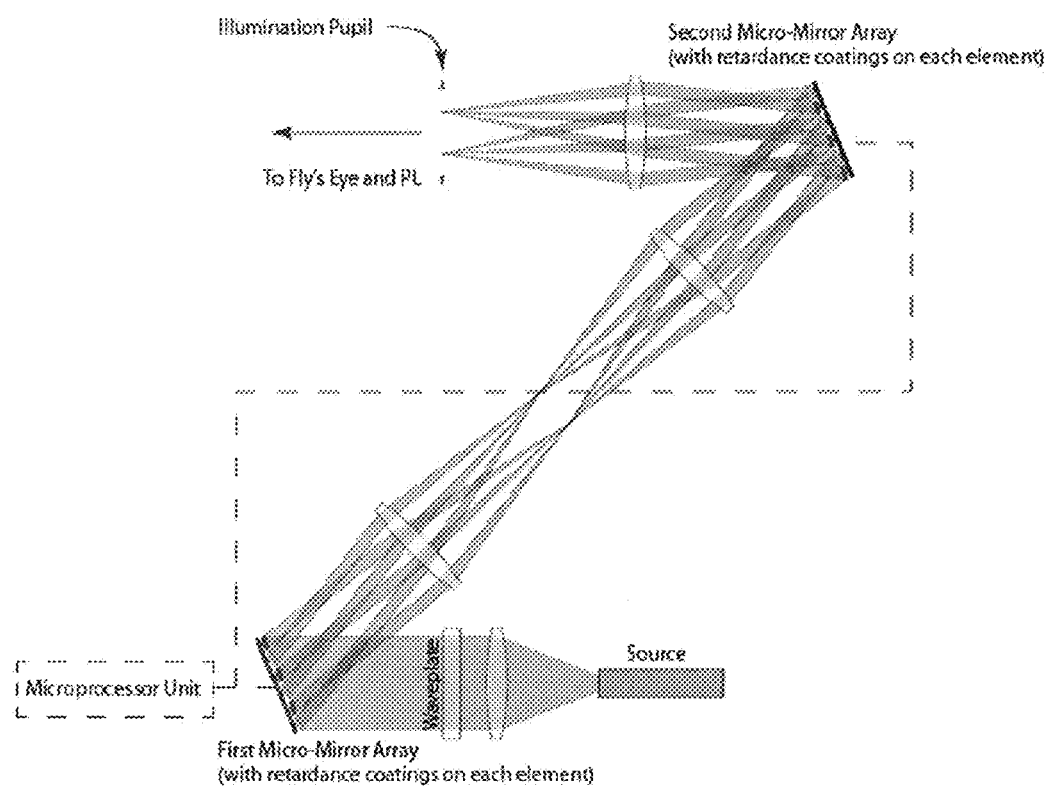
FIGS. 4 and 5 are schematic illustrations of other embodiments in which the present invention can be implemented with two mirror arrays.
Figure 5:
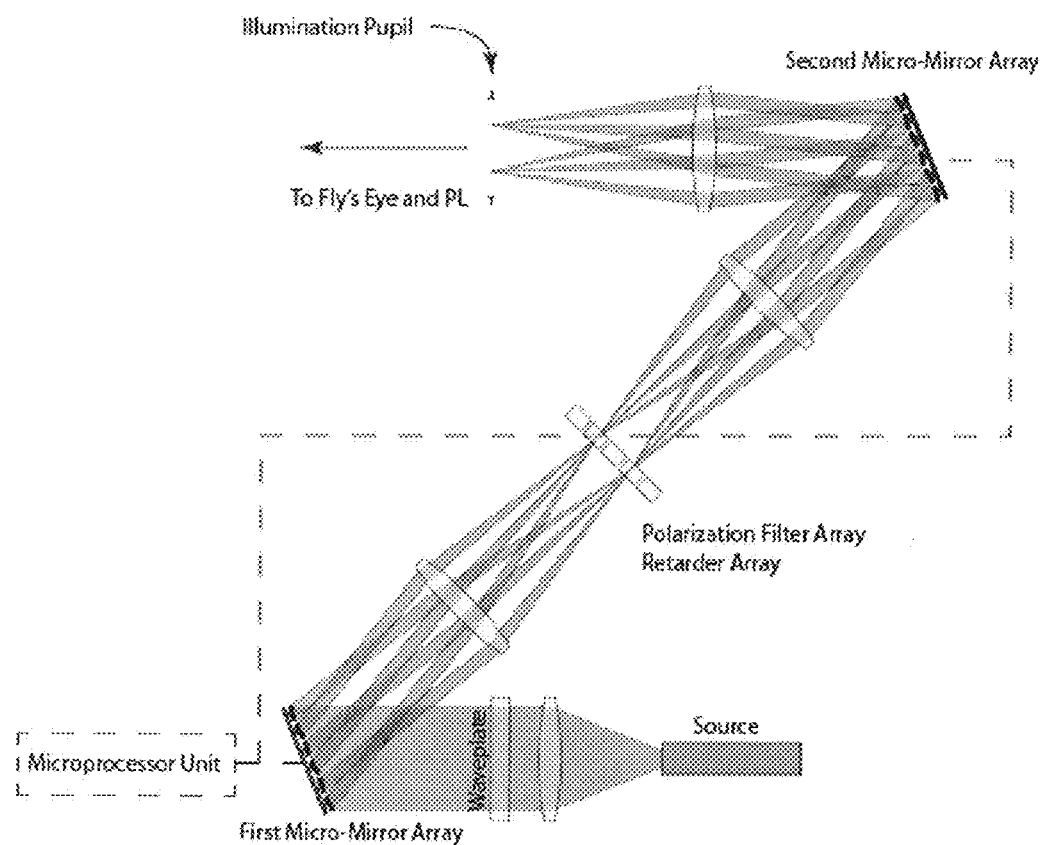

The present invention can also be implemented by the systems shown in FIGS. 4 and 5, where two mirror arrays, each having a set of predetermined retardance coatings on the individual mirror elements, are made conjugate with an intervening relay system, as shown. This implementation is designed to insure that the light leaving a mirror element of the first mirror array will always arrive at a mirror element of the second mirror array. In this configuration (FIG. 4) two mirrors can be used to determine the position of each spot in the illumination pupil, and allow finer control over the polarization. In the implementation of FIG. 5, the polarization control is achieved by directing mirrors of the first mirror array to an array of polarization filters or retarders in the far-field of the lens following the first mirror array. Then the second mirror array, which is nominally conjugate to the first by virtue of a second lens following the filter array, is used to produce the desired distribution of polarization in the illumination pupil.

Although FIG. 5 may seem to indicate that the two mirror arrays have the same number of mirror elements, this is not necessary. It may be advantageous to use many fewer mirror elements in the first array, reducing the complexity of the control hardware and algorithms. In this case, a group of mirror elements in the second mirror arrays are conjugate to a single mirror element in the first mirror array. That group of mirror elements then has a single polarization, depending on which polarization filter is selected by the single mirror element in the first mirror array.

In this embodiment, the relay system has a front optical group and a second optial group. the array of polarization filters or retarders disposed in the relay system, typically disposed between the front and rear optial group. A front focal point of the front optical group may be positioned near the first mirror array, a rear focal point of the front optical group may be positioned near the array of polarization filters or retarders, a front focal point of the rear optical group may be positioned near the array of polarization filters or retarders, and a rear focal point of the front optical group may be positioned near the second mirror array.

Figure 6:
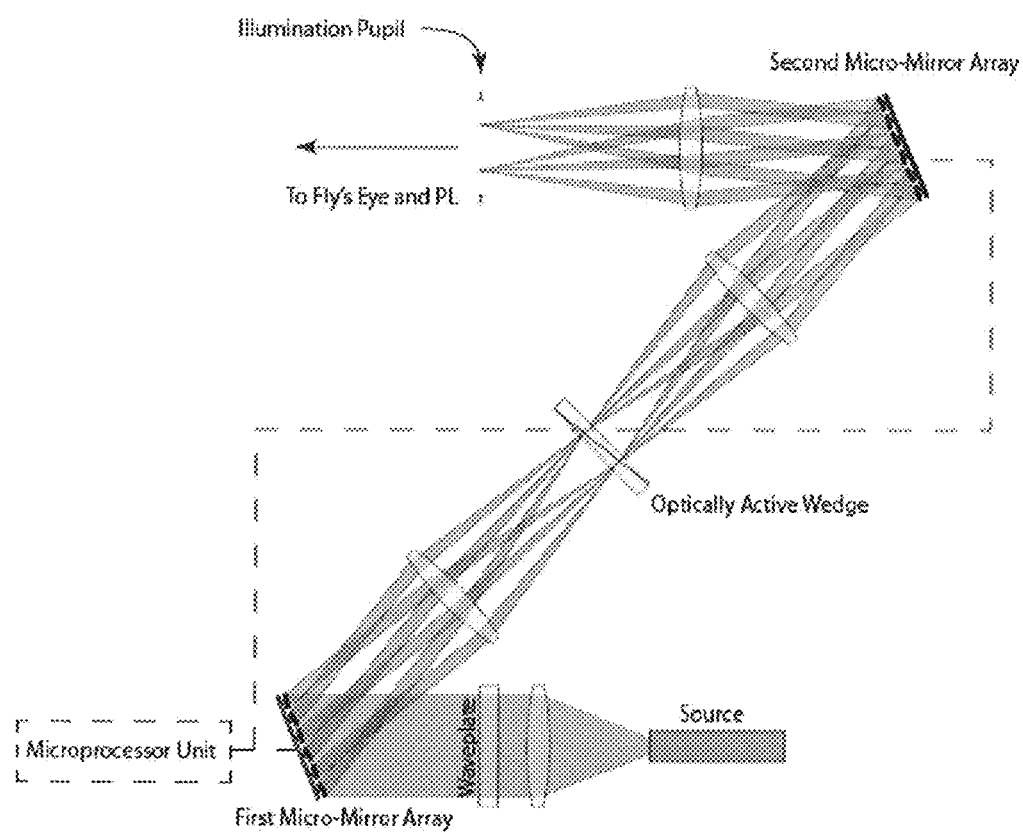
FIG. 6 is a schematic illustration of another embodiment, according to the invention, where a polarization filter array is replaced by a wedge of optically active material

In another embodiment, shown in FIG. 6, the polarization filter array could be replaced by a wedge of optically active material, e.g., quartz crystal. In this way, the orientation of linear polarization leaving the wedge depends continuously on the position of the beam in the wedge.

In these embodiments shown in the FIGS. 4-6, the fourier transforming optical system between the second mirror array and the illumination pupil has a front focal point positioned near the second mirror array and a rear focal point positioned near the illumination pupil. In this embodiment, a lamda/4 plate may be disposed downstream of the fourier transforming optical system.

An illumination system according to the present teaching can be readily implemented in a lithographic optical imaging system at the time the optical imaging system is constructed. Moreover, because it is integrated into the mirror array, an illumination system according to the present invention can be provided as an upgrade to an existing lithographic optical imaging system, without taking up any more space in the system.

Thus, the foregoing description provides an illumination device for source mask optimization of the polarization distribution in the illumination pupil of a lithographic optical imaging system, e.g. for a lithograph optical imaging system that uses ArF (Argon Fluoride) radiation source. The illumination device comprises a mirror array located between a radiation source and an illumination pupil, and each mirror element of the mirror array is individually steerable (controllable), and the polarization state of light from each mirror element, or groups of mirror elements, of the mirror array can be selectively controlled, so that the illumination pupil can be filled with a distribution of light that is selectively controlled. The foregoing description shows various ways in which the present invention can be implemented, and from that description it is believed that various other ways in which the present invention can be implemented will be apparent to those in the art.

The invention claimed is:

1. An illumination device comprising:
a mirror array including an array of mirror elements located between a radiation source and an illumination pupil,
wherein each mirror element of the mirror array is individually steerable;
said mirror array configured such that a polarization state of light reflected from each mirror element of the mirror array is selectively controlled upon reflection, to fill the illumination pupil with a distribution of light that is selectively controlled,
and further comprising a polarization member positioned at a side of the mirror array that faces the radiation source such that light incident on the mirror array from the radiation source traverses the polarization member, to set polarization of the light incident on the mirror array and to make polarization of the light reflected from the mirror array controllably changeable.

2. The illumination device of claim 1, wherein a retarder coating is applied to selected mirror elements of the mirror array to control the polarization state of light reflected from the mirror array.

3. The illumination device of claim 2, wherein the polarization member includes a wave plate.

4. The illumination device of claim 1, further including an additional mirror array between the mirror array and the illumination pupil, wherein the additional mirror array is in optical communication with the mirror array and the illumination pupil to receive light from the mirror array and to direct said light to the illumination pupil.

5. The illumination device of claim 4, wherein the additional mirror array is optically conjugate to the mirror array.

6. The illumination device of claim 5, further comprising an intervening relay system between the mirror array and the additional mirror array.

7. The illumination device of claim 5, wherein an array of at least one of polarization filters and retarders is located between the mirror array and the additional mirror array.

8. The illumination device of claim 5, further comprising a wedge of optically active material located between the mirror array and the additional mirror array such that an orientation of a vector of linear polarization of a beam of light that has reflected from the mirror array and traversed the wedge depends continuously on a position of the beam at the wedge.

9. An illumination device comprising:
a mirror array including an array of mirror elements located between a radiation source and an illumination pupil,
wherein each mirror element of the mirror array is individually steerable and has a corresponding coating on a reflective surface of the minor element,
wherein a coating of a mirror element has a retardance that depends on an angle of incidence of light on said coating,
the device further comprising:
a controller operably connected with the mirror array and configured to control posture of each mirror element of the mirror array so as to fill the illumination pupil with light having a desired polarization distribution.

10. The illumination device of claim 9, further comprising an additional mirror array having an array of individually steerable mirror elements and located between the mirror array and the illumination pupil.

11. The illumination device of claim 10, further comprising
a first group of optical elements between the mirror array and the additional mirror array,
a polarization member between the first group of optical elements and the additional mirror array, and
a second group of optical elements between the polarization member and the additional mirror array,
wherein the mirror array and the additional mirror array are optically conjugate to one another through the and second group of optical elements.

12. The illumination device of claim 10, further comprising a relay system between the mirror array and the additional mirror array, wherein the mirror array and the additional mirror array have different number of respectively corresponding mirror elements, and wherein a group of mirror element of one of the mirror array and the additional mirror array is optically conjugate to a single mirror element of another of the mirror array and the additional mirror array.

13. An illumination device comprising:
a first mirror array including an array of mirror elements located between a radiation source and an illumination pupil;
a second minor array including an array of mirror elements located between the first mirror array and the illumination pupil; and
a relay system between the first and second minor arrays,
wherein each mirror element of the first and second mirror arrays is individually steerable,
wherein each mirror element of a mirror array from the first and second mirror arrays has a coating on a reflective surface of the mirror element, said coating having a retardance that depends on an angle of incidence of light thereon,
the device further comprising:
a controller operably connected with the mirror array and configured to control posture of each mirror element of the mirror array so as to fill the illumination pupil with light having a desired polarization distribution.

14. The illumination device of claim 13, further comprising a polarization member disposed in the relay system.

15. The illumination device of claim 14, wherein the polarization member comprises an array of discrete polarization elements.

16. The illumination device of claim 14, wherein the polarization member includes a wedge of optically active material between the first and second mirror arrays.

17. The illumination device of claim 14, wherein the first and second mirror arrays are optically conjugate to one another.

18. The illumination device of claim 14, wherein the first and second mirror arrays have different number of respectively corresponding mirror elements, and wherein a group of mirror elements of one of the first and second mirror arrays is optically conjugate to a single mirror element of another of the first and second mirror arrays.

19. The illumination device of claim 13, wherein the relay system includes first and second groups of optical elements and a polarization member between the first and second groups of optical elements.

20. A method for illuminating an illumination pupil of an optical imaging system, the method comprising:
    irradiating a first mirror array with radiation that has passed through a polarization member from a radiation source, the first mirror array including an array of mirror elements each of which mirror elements is individually steerable;
    reflecting said radiation such by mirror elements of said first mirror array to form a plurality of distributions of light reflected from the mirror elements such that a polarization state of each of said distributions is selectively controlled, and
    filling the illumination pupil with a pupil distribution of light defined by said plurality of distributions, wherein said pupil distribution of light is selectively controlled.

21. The method of claim 20, wherein said reflecting includes transmitting said radiation, upon said reflecting, through retarder coatings carried by selected mirror elements of the first mirror array to control a polarization state of light of said pupil distribution of light.

22. The method of claim 20, further comprising:
    reflecting radiation received from the first mirror array by a second mirror array toward the illumination pupil.

23. The method of claim 22, further comprising defining the second mirror array to be optically conjugate to the first mirror array.

24. The method of claim 23, further comprising transmitting radiation reflected by the first mirror array through an intervening relay system between the first mirror array and the second mirror array.

25. The method of claim 23, further comprising transmitting radiation reflected by the first mirror array through at least one of i) polarization filters and ii) retarders, said at least one of polarization filters and retarders located between the first mirror array and the second mirror array.

26. The method of claim 23, further comprising transmitting radiation reflected by the first mirror array through a wedge of optically active material located between the first mirror array and the second mirror array, to define a vector of linear polarization of a beam of radiation transmitted through said wedge to be dependent on a position of said beam on the wedge.

27. An illumination apparatus configured to illuminate a target surface with light from a light source, the apparatus comprising:
    a first array of mirror elements disposed between the light source and the target surface, wherein each of said mirror elements of the first array is steerable;
    a second array of mirror elements on which a second plurality of polarization elements is provided;
    an optical system between the first array of mirror elements and the target surface, the optical system configured to receive light from the first array of mirror elements;
    a first plurality of polarization elements disposed in an illumination path between the optical system and the target surface, wherein each of polarization elements from said first plurality of polarization elements is configured to change a polarization state of the light upon interaction therewith; and
    wherein the second plurality of polarization elements is disposed in the illumination path between the first plurality of polarization elements and the target surface.

28. An apparatus according to claim 27, further comprising: a controller configured to control orientation of a polarization element from said first plurality of polarization elements.

29. An apparatus according to claim 28, wherein said first plurality of polarization elements includes a waveplate.

30. An apparatus according to claim 27, wherein mirror elements from the second array of mirror elements are tiltable.

31. An apparatus according to claim 27, wherein the second array of mirror elements is in optical communication with the first array of mirror elements in said light.

* * * * *